United States Patent
Yoshimizu et al.

(10) Patent No.: US 9,653,475 B1
(45) Date of Patent: May 16, 2017

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Yasuhito Yoshimizu, Mie (JP); Hiroaki Yamada, Mie (JP); Yoshinori Kitamura, Mie (JP); Yoshihiro Ogawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/185,510

(22) Filed: Jun. 17, 2016

(30) Foreign Application Priority Data

Dec. 1, 2015 (JP) ................... 2015-234780

(51) Int. Cl.
H01L 21/4763 (2006.01)
H01L 27/11582 (2017.01)
H01L 21/8234 (2006.01)
H01L 29/06 (2006.01)

(52) U.S. Cl.
CPC .......... *H01L 27/11582* (2013.01); *H01L 21/823475* (2013.01); *H01L 21/823481* (2013.01); *H01L 29/0649* (2013.01)

(58) Field of Classification Search
None
See application file for complete search history.

(56) References Cited

U.S. PATENT DOCUMENTS

| 6,001,215 A | 12/1999 | Ban |
| 8,723,247 B2 * | 5/2014 | Komori ............... H01L 29/7926 257/324 |
| 2009/0242967 A1 | 10/2009 | Katsumata et al. |
| 2012/0211820 A1 | 8/2012 | Komori et al. |
| 2014/0090669 A1 | 4/2014 | Hinode et al. |

FOREIGN PATENT DOCUMENTS

WO  WO 2014/077199 A1  5/2014

* cited by examiner

*Primary Examiner* — Jack Chen
(74) *Attorney, Agent, or Firm* — Finnegan, Henderson, Farabow, Garrett & Dunner, LLP

(57) ABSTRACT

According to one embodiment, a method of manufacturing a semiconductor device includes: forming a first film including a conductive material above a semiconductor substrate; forming a second film on the first film; forming a third film including a conductive material on the second film; exposing a part of the second film; and wet etching the second film. In the wet etching, a first and second insulation films are deposited on side surfaces of the first and third films, and part of a space between the first and third films is blocked by the first and second insulation films to form an air gap between the first and third films.

9 Claims, 16 Drawing Sheets

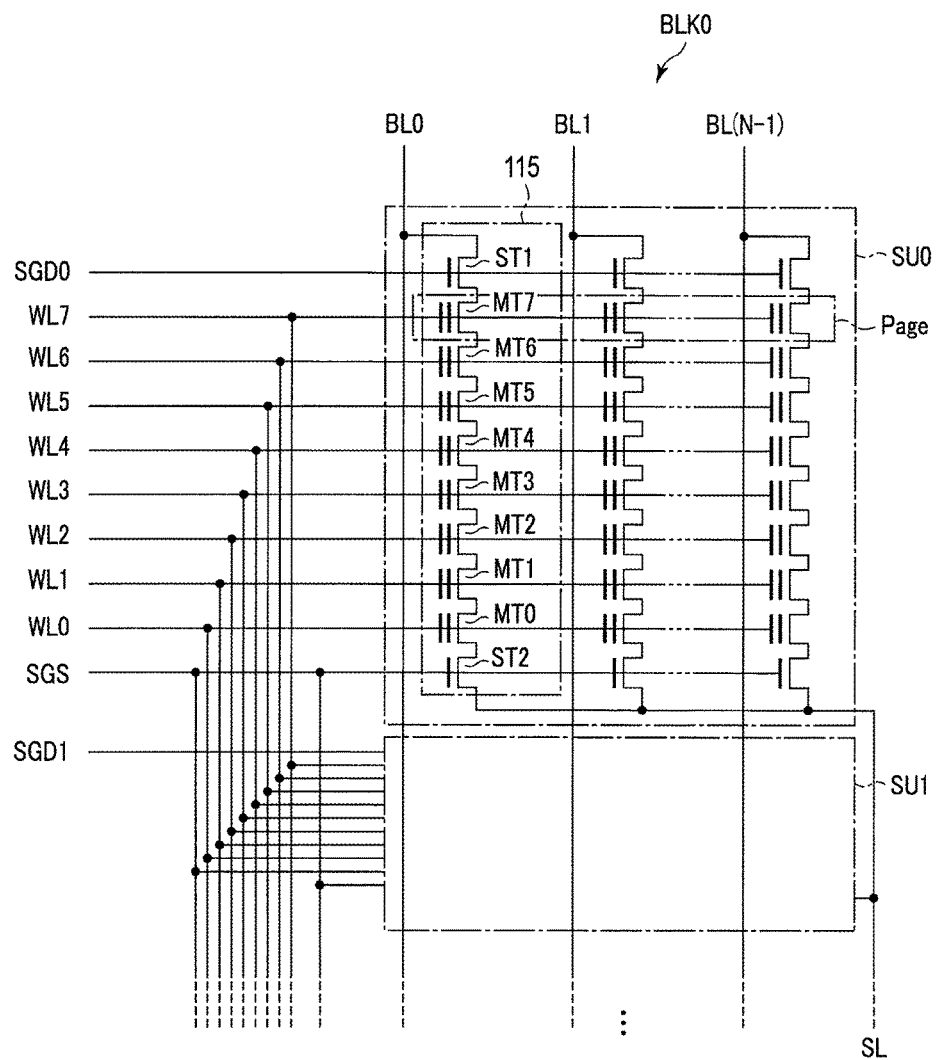
F I G. 2

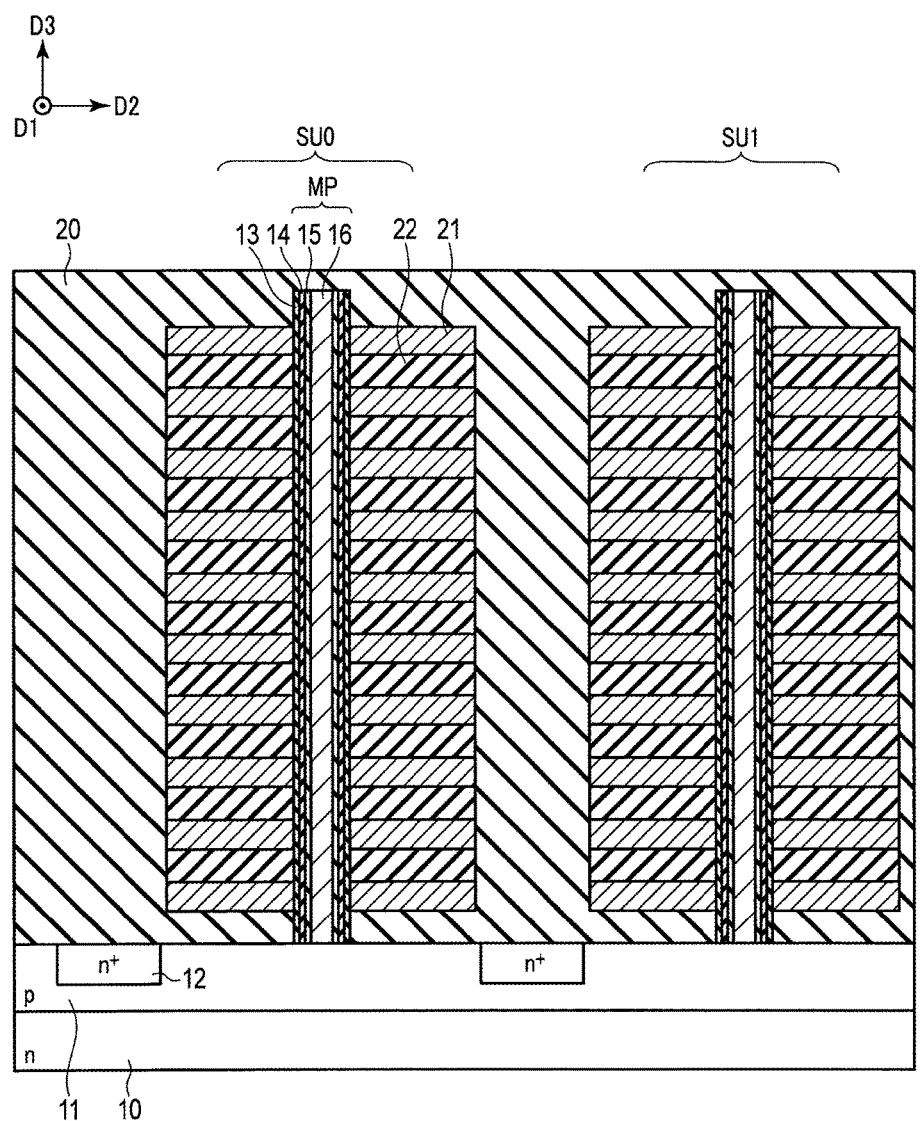
F I G. 4

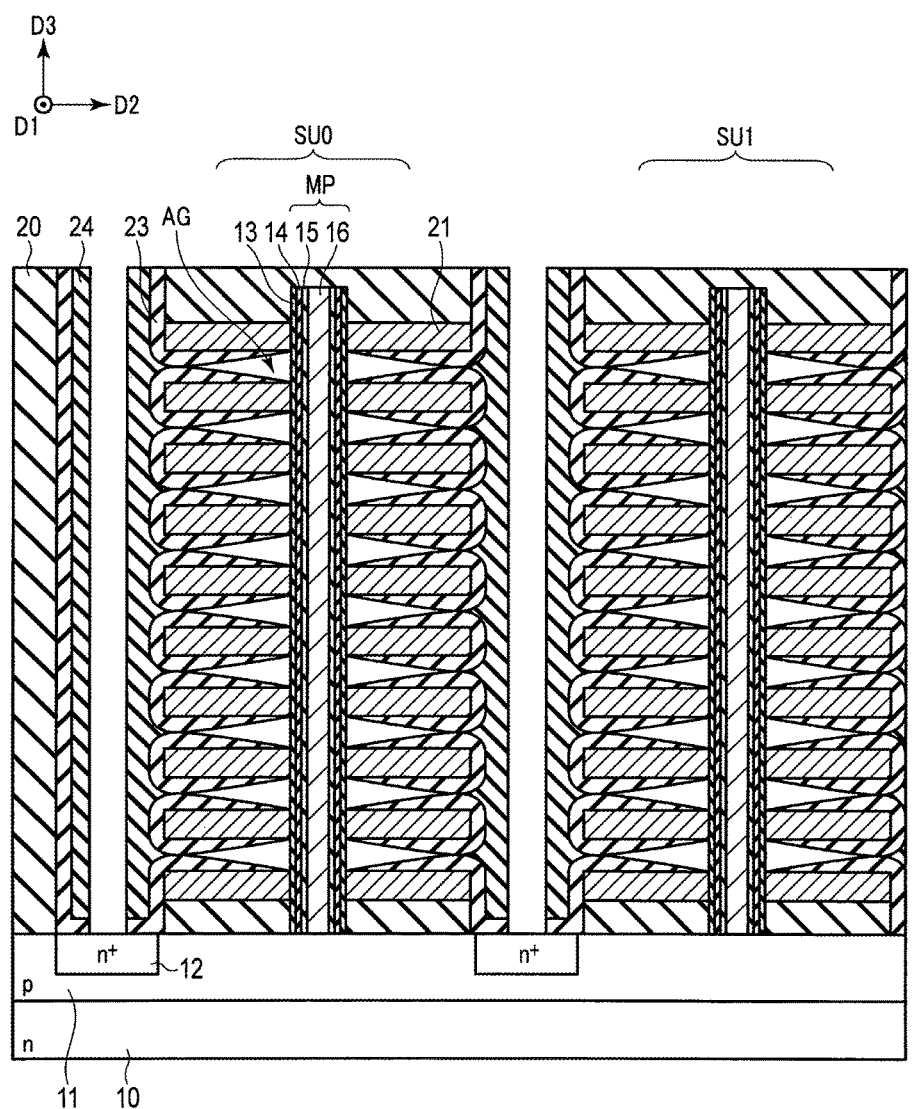
F I G. 7

|  | Speed of deposition |
|---|---|
| Si concentration | ⬆ |
| H$_3$PO$_4$ concentration | ⬇ |
| H$_3$PO$_4$ temperature | ⬇ |
| Flow speed of solution | ⬇ |

F I G. 8

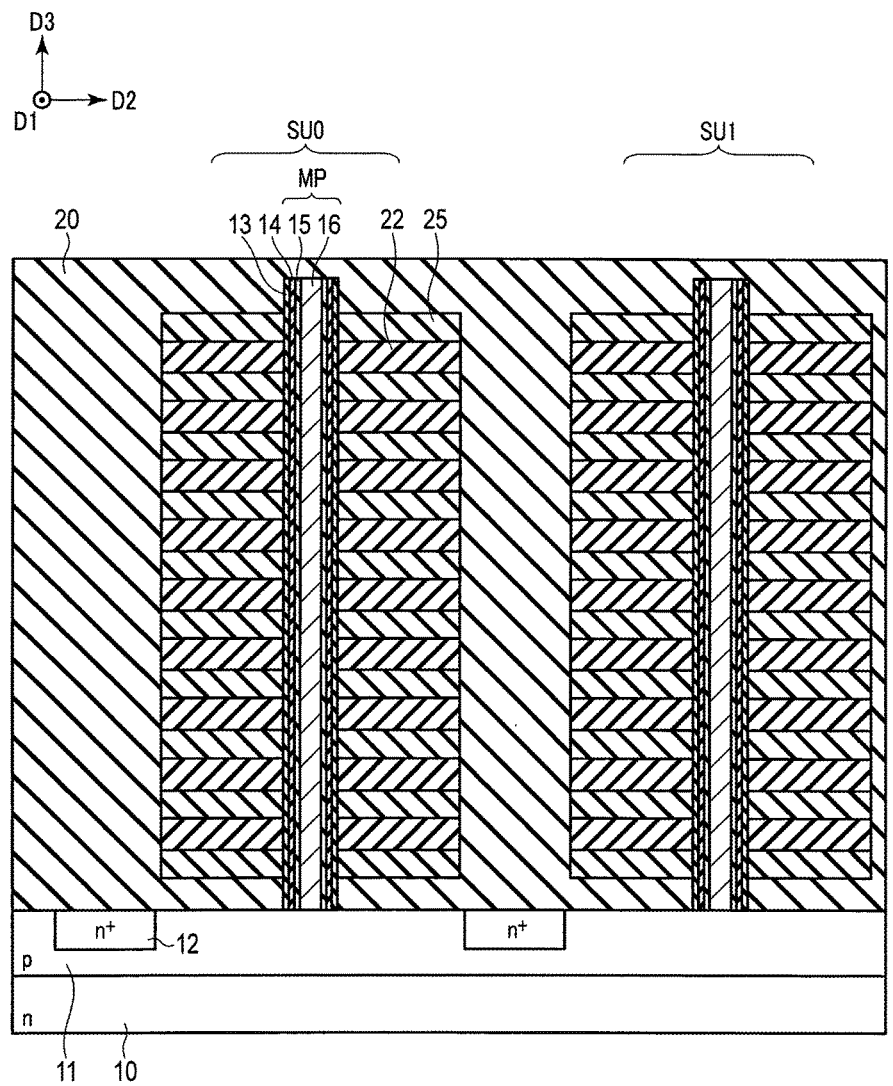
F I G. 9

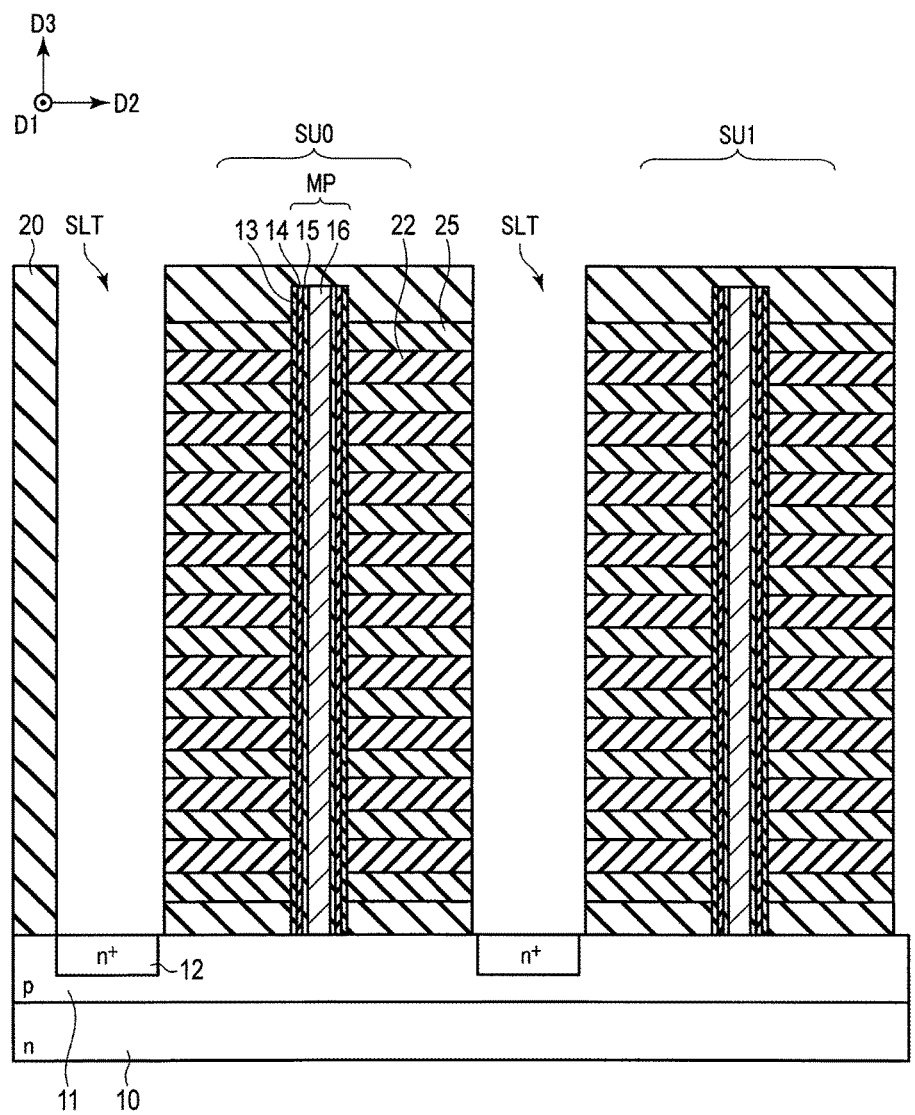
F I G. 10

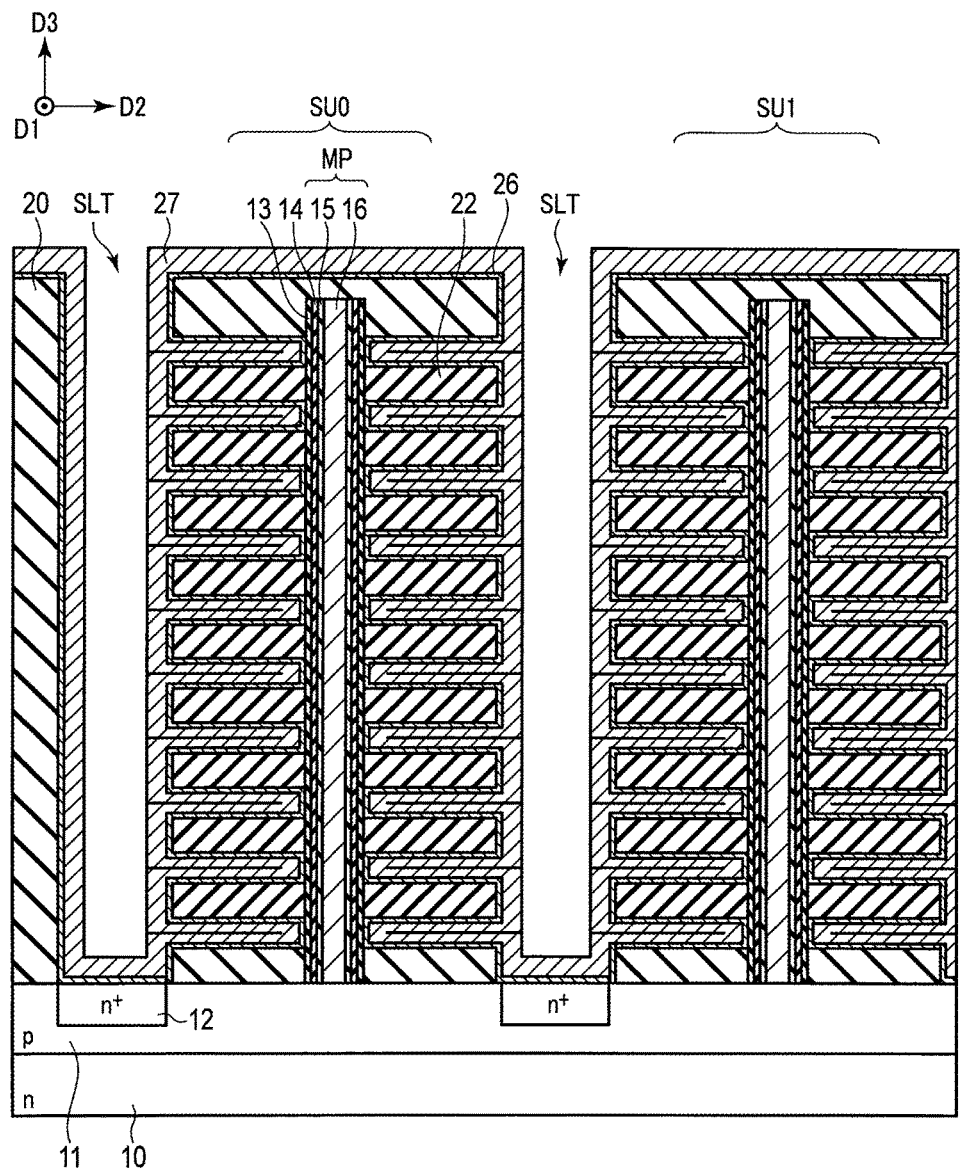
F I G. 12

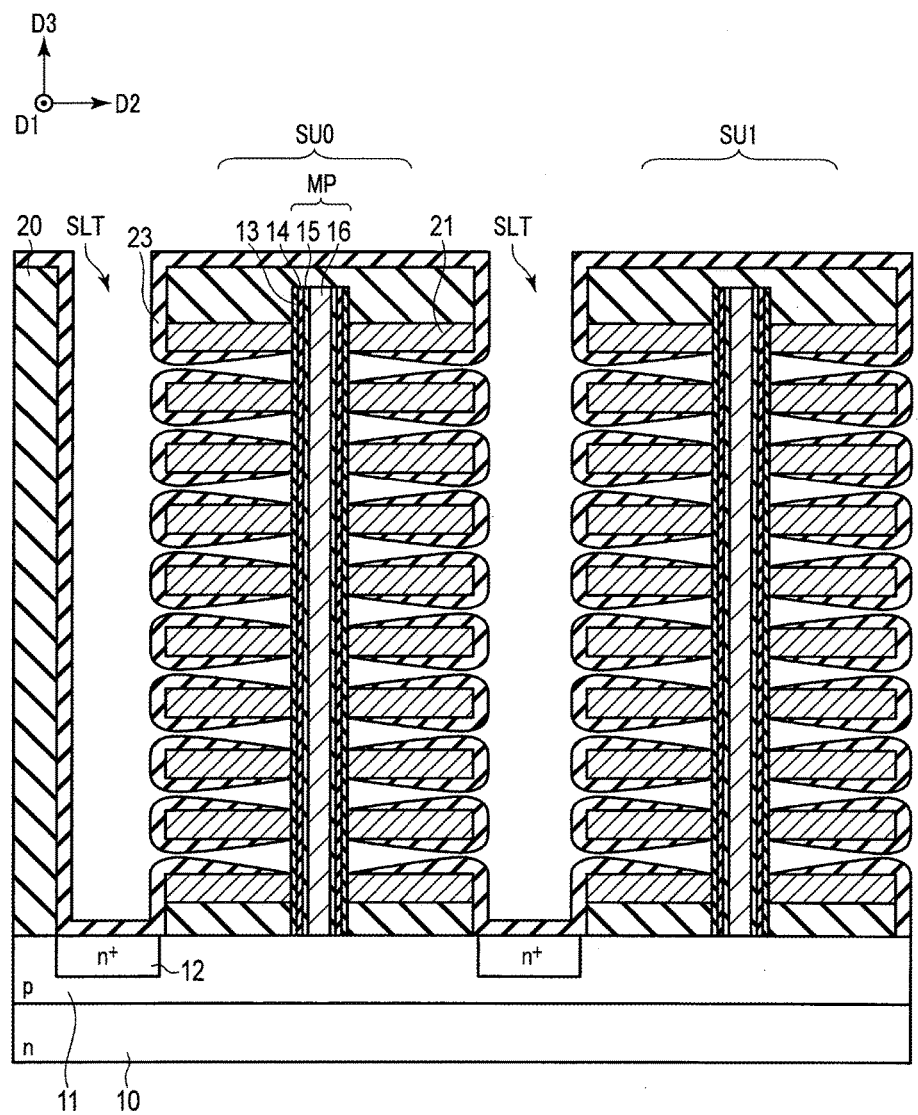
F I G. 15

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2015-234780, filed Dec. 1, 2015, the entire contents of which are incorporated herein by reference.

FIELD

Embodiments described herein relate generally to a semiconductor device and a method of manufacturing the same.

BACKGROUND

NAND type flash memories are known as semiconductor devices.

BRIEF DESCRIPTION OF THE DRAWINGS

FIG. 2 is a circuit diagram of a memory cell array in the semiconductor device according to the first embodiment;

FIGS. 4 to 7 are cross sectional views illustrating the process of the manufacturing method of the semiconductor device according to the first embodiment;

FIG. 8 is a table showing the relationship between the wet etching conditions of SiN and the deposition rate of $SiO_2$ in the manufacturing method of the semiconductor device according to the first embodiment;

FIGS. 9 to 14 are cross sectional views illustrating the process of the manufacturing method of the semiconductor device according to the second embodiment; and FIGS. 15 and 16 are cross sectional views illustrating the process of the manufacturing method of the semiconductor device according to the third embodiment.

DETAILED DESCRIPTION

In general, according to one embodiment, a method of manufacturing a semiconductor device includes: forming a first film including a conductive material above a semiconductor substrate; forming a second film including Si and N on the first film; forming a third film including a conductive material on the second film; exposing a part of the second film; and wet etching the second film. In the wet etching, a first and second insulation films each including Si are deposited on side surfaces of the first and third films, and part of a space between the first and third films is blocked by the first and second insulation films to form an air gap between the first and third films.

1. First Embodiment

A semiconductor device according to the first embodiment and a method of manufacturing the semiconductor device will be explained. In the following description, a three-dimensionally stacked NAND type flash memory in which memory cell transistors are stacked above a semiconductor substrate is explained as an example of a semiconductor device.

1.1 Structure

1.1.1 Overall Configuration of Semiconductor Device

Figure 1:
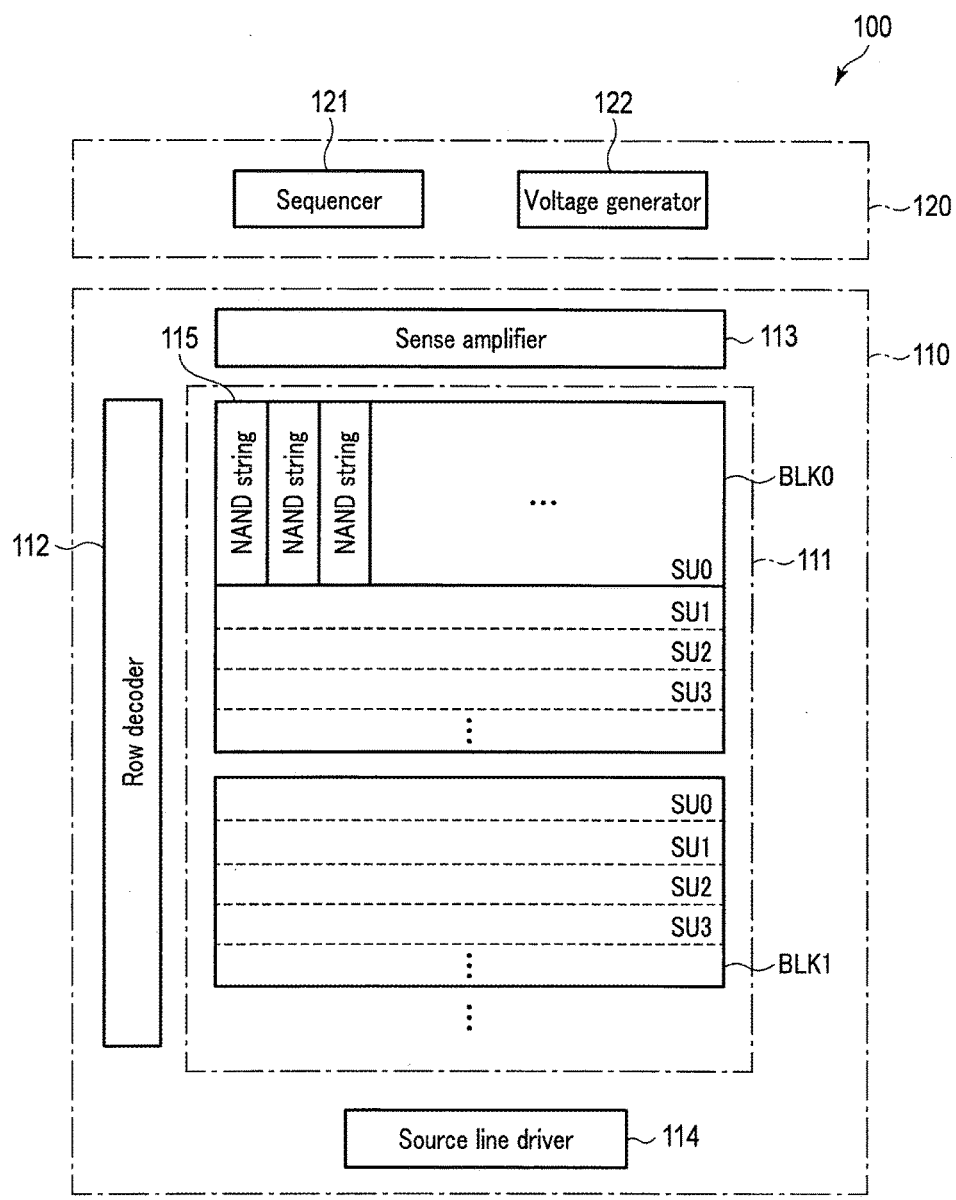
FIG. 1 is a block diagram of a semiconductor device according to the first embodiment.

To start, an overall configuration of the semiconductor device will be explained. FIG. 1 is a block diagram showing the overall configuration of NAND type flash memory 100.

As shown in FIG. 1, the NAND type flash memory 100 generally includes a core part 110 and a peripheral circuit 120.

The core part 110 includes a memory cell array 111, a row decoder 112, a sense amplifier 113, and a source line driver 114.

The memory cell array 111 includes a plurality of blocks BLK (BLK0, BLK1, and so on) that are a set of a plurality of nonvolatile memory cell transistors. For example, data within a single block BLK is erased in a batch.

Each block BLK includes a plurality of string units SU (SU0, SU1, and so on). Each string unit SU includes a plurality of NAND strings 115. A plurality of memory cell transistors are connected in series within each NAND string 115. The number of blocks BLK, string units SU, and NAND strings 115 may be discretionarily determined.

The row decoder 112 decodes an address of a block ELK or an address of a page to select a target word line when writing or reading data, for example.

The sense amplifier 113 senses data read from a memory cell transistor to a bit line when reading data. The sense amplifier 113 transfers data to be written to a memory cell transistor when writing data.

The source line driver 114 applies a required voltage to a source line when writing, reading, and erasing data.

The peripheral circuit 120 includes a sequencer 121 and a voltage generator 122.

The sequencer 121 controls the entire operation of the NAND type flash memory 100.

The voltage generator 122 generates a required voltage for writing, reading, and erasing data to supply the voltage to the row decoder 112, the sense amplifier 113, and the source line driver 114, for example.

1.1.2 Configuration of Memory Cell Array

Next, the configuration of the memory cell array 111 will be explained. FIG. 2 is a circuit diagram of the memory cell array 111.

As shown in FIG. 2, each of the NAND strings 115 includes, for example, eight memory cell transistors MT (MT0 to MT7) and select transistors ST1 and ST2. The memory cell transistor MT includes a stacked gate including a control gate and a charge accumulation layer, and stores data in a nonvolatile manner. The memory cell transistor MT may be a MONOS type memory transistor that uses an insulation film as a charge accumulation layer, or an FG type memory transistor that uses a conductive film as a charge accumulation layer. In the present embodiment, a MONOS type memory transistor will be explained as an example. The number of the memory cell transistors MT is not limited to eight, and may be set at 16, 32, 64, 128, etc. In addition, the number of each of select transistors ST1 and ST2 may be discretionarily determined.

Electric current paths of the memory cell transistors MT0 to MT7 are connected in series. A drain of the memory cell transistor MT7 is connected to a source of the select transistor ST1, and a source of the memory cell transistor MT0 is connected to a drain of the select transistor ST2.

Gates of the select transistors ST1 within a single string unit SU are commonly connected to a single select gate line SGD. In FIG. 2, gates of the select transistors ST1 within the string unit SU0 of the block BLK0 are commonly connected to a select gate line SGD0, and gates of the select transistors ST1 within the string unit SU1 not shown in the drawing are commonly connected to a select gate line SGD1.

Gates of the select transistors ST2 within a single block BLK are commonly connected to a single select gate line SGS.

Control gates of the memory cell transistors MT0 to MT7 in each NAND string 115 within a single block BLK are commonly connected to different word lines WL0 to WL7, respectively.

A drain of a select transistor ST1 of each of the NAND strings 115 arranged in a single column among the NAND strings 115 arranged in a matrix pattern within the memory cell array 111 is connected respectively to a different bit lines BL (BL0 to BL (N-1); (N-1) is a natural number equal to or greater than 1). In addition, a drain of a select transistor ST1 of each of the NAND strings 115 arranged in a single row is commonly connected to any one of bit lines BL0 to BL(N-1). That is, the bit line BL commonly connects the NAND string 115 of each of the string unit SU between the plurality of blocks BLK. In addition, sources of the select transistors ST2 within each block BLK are commonly connected to a source line SL. That is, the source line SL commonly connects the NAND strings 115 within the memory cell array 111.

Figure 3:
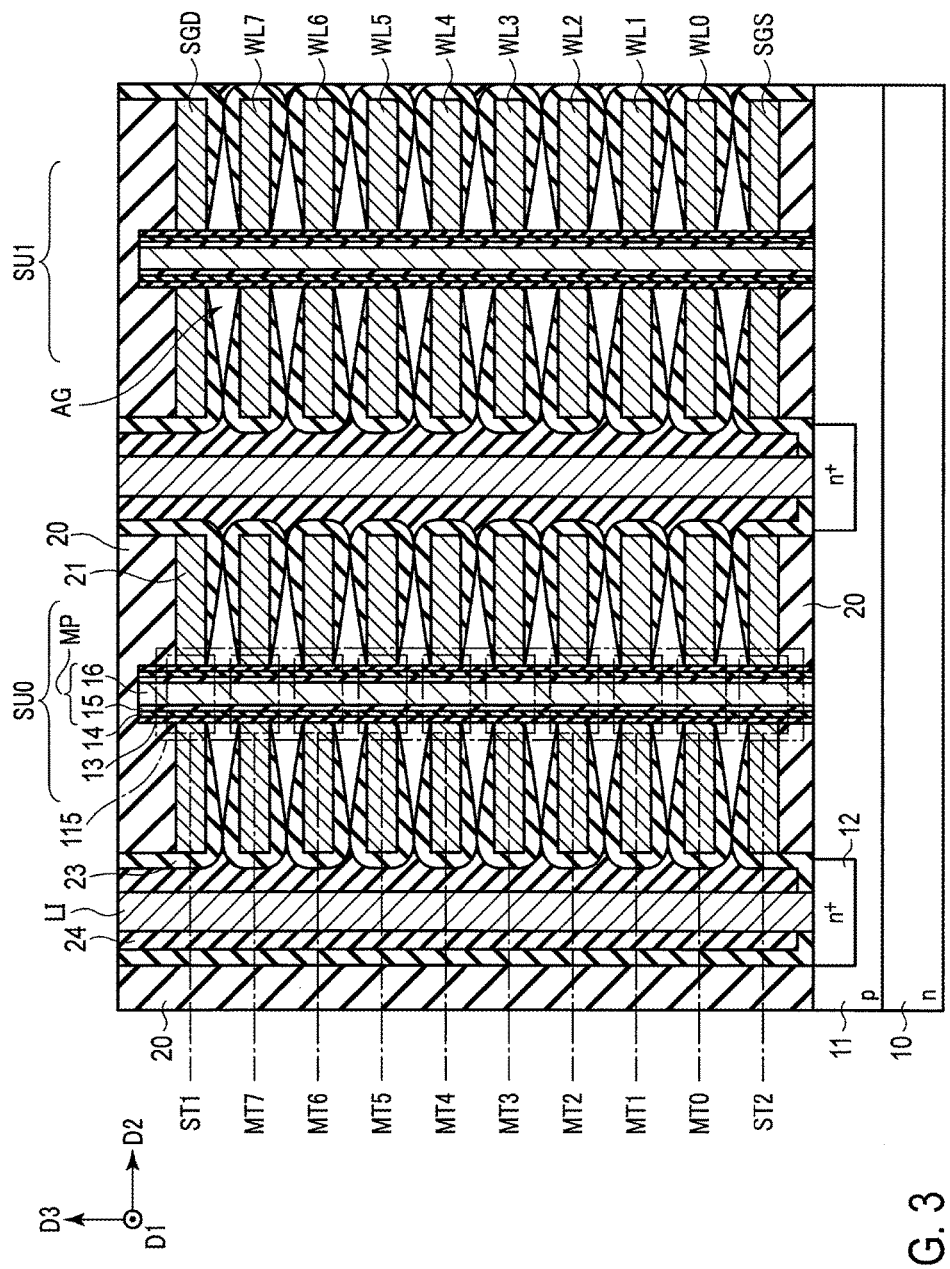
FIG. 3 is a cross-sectional view of the memory cell array in the semiconductor device according to the first embodiment.

Next, the configuration of the memory cell array 111 will be explained in detail. FIG. 3 is a cross-sectional view of the string units SU0 and SU1.

As shown in FIG. 3, a string unit SU and a source line contact LI are periodically arranged in a second direction D2 parallel to the semiconductor substrate 10. In each string unit SU, a NAND string 115 is formed in a third direction D3 vertical to the semiconductor substrate 10. The plurality of NAND strings 115 within a string unit SU are arranged along a line in a first direction D1. The source line contact LI has a line shape extending in the first direction D1, for example.

Next, the configuration of the NAND string 115 will be explained in detail. The semiconductor substrate 10 has a p-type well 11 on a surface area. The p-type well 12 has an n$^+$ type diffusion layer 12 on a surface area. An insulation layer 20 is formed on the semiconductor substrate 10, and a plurality of interconnect layers 21 functioning as a select gate line SGS, word lines WL0 to WL7, and a select gate line SGD are sequentially stacked with a space therebetween. For example, SiO$_2$ (silicon dioxide) is used for the insulation layer 20. The interconnect layer 21 is formed of a conductive material, for example, W (tungsten). An insulation film 23 is formed to cover each interconnect layer 21. An air gap AG sandwiched between adjacent insulation films 23 is formed between adjacent interconnect layers 21. For example, SiO$_2$ is used for the insulation layer 23. In FIG. 3, the air gap AG has a triangle shape by the side surface of a memory hole MH and the adjacent insulation layers 23. The air gap AG may have a triangle shape with bent sides, or rounded corners.

The memory hole MH is formed by passing through the interconnect layers and insulation films to the p-type well 11. A block insulation film 13, a charge accumulation film 14, and a tunnel insulation film 15 are sequentially formed on the side surface of the memory hole MH, and the inside of the memory hole MH is filled with the semiconductor layer 16. For example, SiO$_2$ is used for the block insulation layer 13 and the tunnel insulation film 15. For example, SiN (silicon nitride) is used for the charge accumulation film 14.

For example, Poly-Si (polycrystalline silicon) is used for the semiconductor layer 16. The semiconductor layer 16 within the memory hole MH is a region where a channel is formed when the memory cell transistor MT and select transistors ST1 and ST2 are in an ON state. A pillar formed of the block insulation layer 13, charge accumulation film 14, tunnel insulation film 15, and semiconductor layer 16 within the memory hole MH is called a "memory pillar MP". A plurality of memory pillars MP included in each string unit SU each have a contact plug, not shown in the drawings, on the upper surface and are connected to different bit lines BL.

The memory cell transistors MT0 to MT7 are formed by the memory pillars MP and the word lines WL0 to WL7. Similarly, the select transistors ST1 and ST2 are formed by the memory pillars MP and the select gate lines SGD and SGS.

The select gate lines SGD and SGS may be stacked as more than two layers, and the number thereof is not limited. In addition, the NAND strings 115 may include a dummy memory cell transistor MT. In this case, a dummy word line WL may be provided between the select gate line SGS and the word line WL0, or between the select gate line SGD and the word line WL7.

Furthermore, the plurality of NAND strings 115 within each string unit SU are not limited to be arranged along a line in the first direction D1, and may be arranged in two or more parallel lines or in a staggered pattern.

The source contact LI is connected to the n$^+$ type diffusion layer 12 at the bottom surface, and is connected to the source line SL at the upper surface not shown in the drawings. For example, Poly-Si is used for the source contact LI. Insulation layers 24 are formed on the side surfaces of the source line contact LI. Specifically, the insulation layers 24 are formed to sandwich the source line contact LI from both sides in the first direction D1. For example, SiO$_2$ is used for the insulation layer 24. The insulation layer 24 may be omitted.

1.2 Method of Forming an Air Gap

The method of forming an air gap will be explained. FIGS. 4 to 7 are cross-sectional views of the memory cell array in the manufacturing step of the semiconductor device. In the embodiment, when wet etching an insulation layer formed between adjacent interconnect layers 21, the insulation film 23 is deposited at the same time of wet etching, and a gap between interconnect layers 21 is blocked by the insulation film 23, in order to form an air gap AG.

As shown in FIG. 4, the plurality of interconnect layers 21 and the insulation layers 22 alternately stacked one another, and a plurality of memory pillars MP passing through the plurality of interconnect layers 21 and the insulation layers 22 and connected to the p-type well 11 are formed in each string unit SU. Then, the insulation layer 20 that covers the entire string unit SU is formed. That is, the insulation layers 22 are formed between the adjacent interconnect layers 21 each including the word lines WL, and the select gate lines SGD and SGS.

In the following description, an example where SiN is used for the insulation layer 22, and SiO$_2$ is used for the insulation film 23 is explained.

The insulation layer 22 is not limited to be formed of SiN, and may be formed of an insulation material including Si (silicon) and N (nitrogen) as structural elements and having a Si—N coupling, for example, SiON (silicon oxynitride). The insulation layer 22 is also not limited to be formed of an insulation material including Si and N, and may be formed of a material which can obtain a necessary selection wet etching ratio with respect to the interconnect layer 21, and can deposit a reaction product (insulation film 23) by wet etching.

Figure 5:
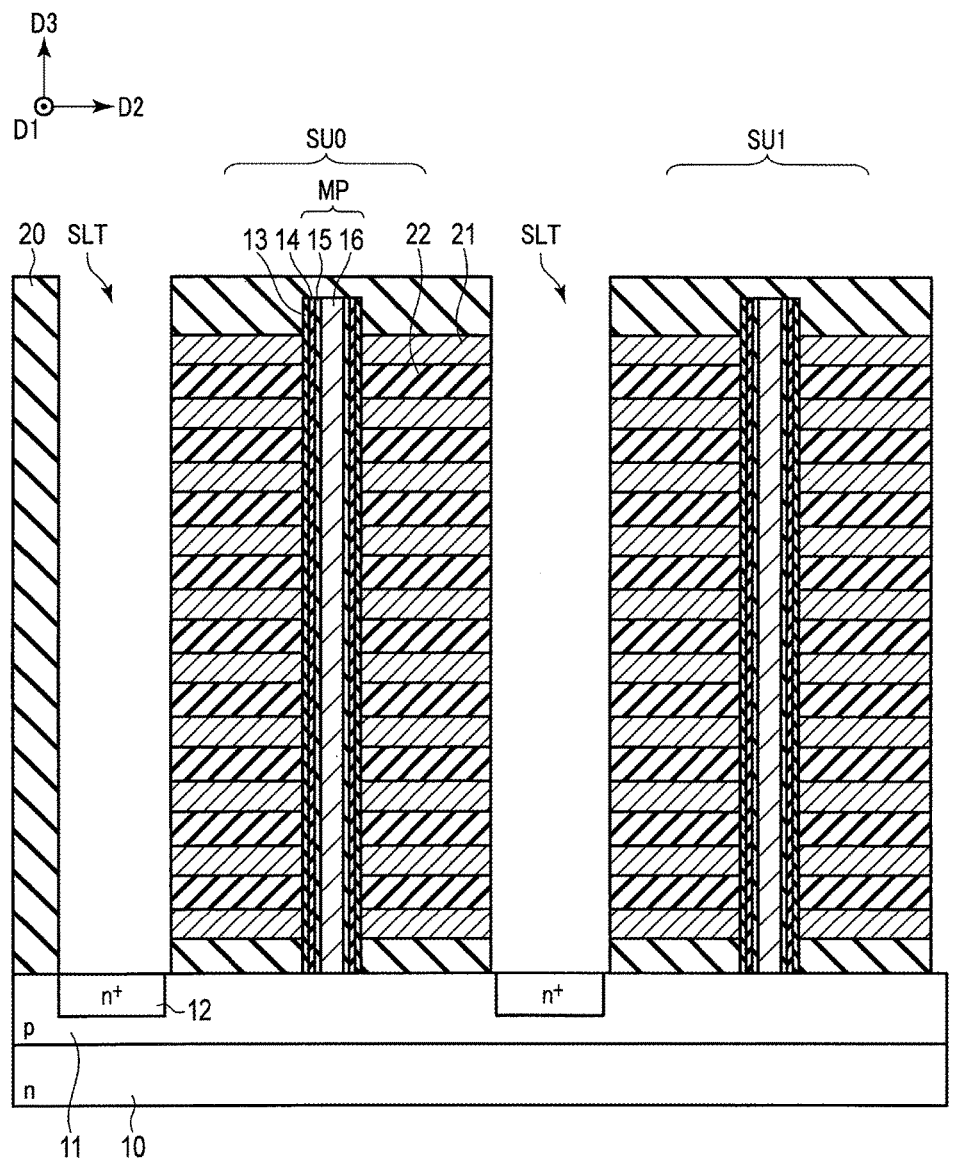

As shown in FIG. 5, a slit SLT is formed along the first direction D1 to expose an end (side surface) of the insulation layer 22 of each string unit SU. That is, the slit SLT and the string unit SU are alternately arranged in the second direction D2.

Figure 6:
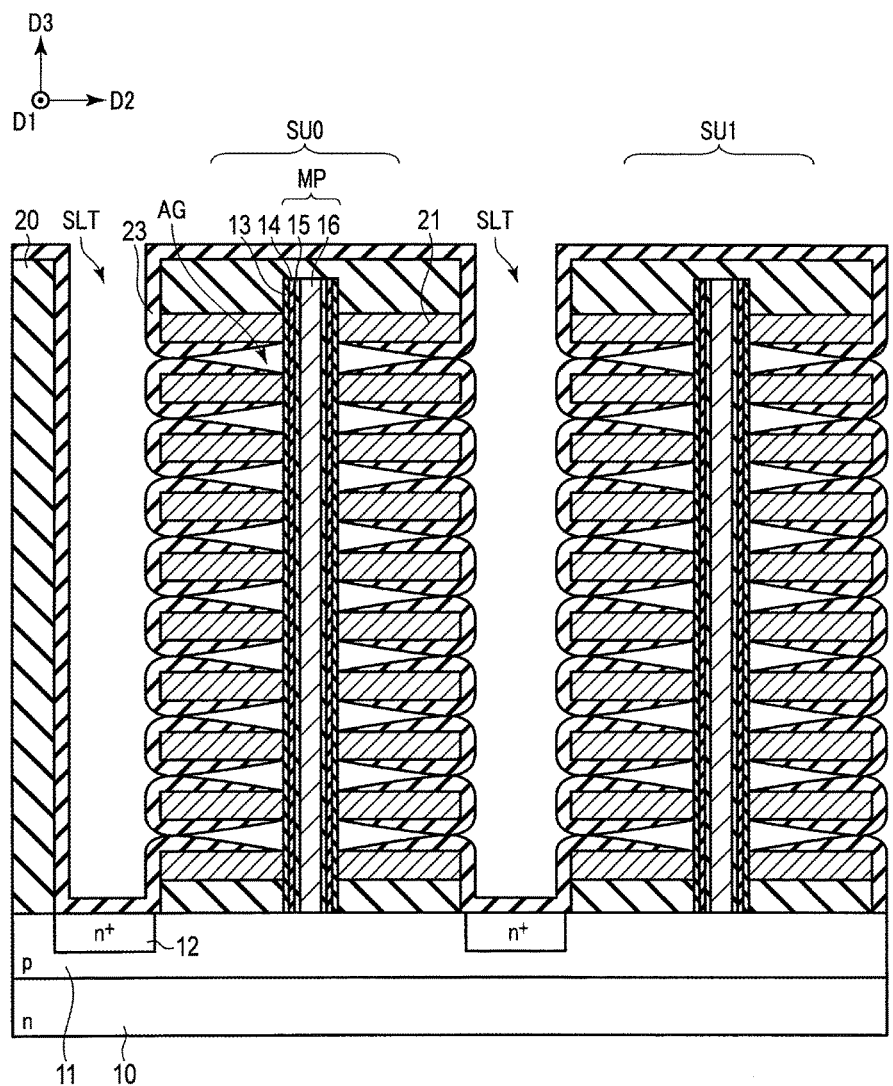

Next, the insulation layer 22 is wet etched as shown in FIG. 6. In this step, the insulation film 23 deposited from an etching solution covers the upper surface of the insulation layer 20, the side surface of the slit SLT (side surface of the insulation layer 20), the bottom surface of the slit SLT (front surface of the semiconductor substrate 10), and the interconnect layer 21. Accordingly, part of a gap (space) between interconnect layers 21 formed by the wet etching is closed by the adjacent insulation film 23 to form an air gap AG. Specifically, when the semiconductor substrate 10 is immersed in the etching solution of SiN, the exposed insulation layer 22 (SiN) within the slit SLT is wet etched, and a gap is formed between the adjacent interconnect layers 21. If the etching solution is hardly stirred, for example, the Si concentration of the etching solution becomes high in the vicinity of the semiconductor substrate 10, i.e., the vicinity of the area where the insulation layer 22 (SiN) is etched. If the Si concentration exceeds a saturation solubility of etching solution, the insulation film 23 ($SiO_2$) is deposited. The insulation film 23 ($SiO_2$) is formed thick at the end of the interconnect layer 21, and accordingly closes the gap. By this process, an air gap AG enclosed by the vertically adjacent insulation films 23 ($SiO_2$) and the block insulation layer 13 is formed.

Next, as shown in FIG. 7, a sidewall by an insulation layer 24 formed, for example, of $SiO_2$ is formed within the slit SLT to cover the insulation film 23. Specifically, an insulation layer 24 is formed to cover the entire upper surface of the insulation layer 20 and the slit SLT. Then, the insulation film 23 and the insulation layer 24 formed on the upper surface of the insulation layer 20 and the bottom part of the slit SLT are removed by etching so that the semiconductor substrate 10 is exposed at the bottom part of the slit SLT, and a sidewall by the insulation layer 24 is formed within the slit SLT.

The slit SLT is then filled with a semiconductor layer to form the source line contact LI, as shown in FIG. 3.

A thermal annealing process may be executed after the insulation layer 22 is wet etched. By so doing, the moisture content within the air gap AG and the insulation film 23 may be removed, or the insulation film 23 may be improved.

In addition, the insulation layer 22 may not be completely removed between the adjacent interconnect layers 21, and may remain in the vicinity of the memory pillars MP, for example.

Furthermore, if SiN is used as the insulation layer 22, for example, a thermal annealing process may be executed in a nitrogen atmosphere after a SiN film is formed, or in the state where SiN is exposed after forming the slit SLT. It is also possible to control the wet etching rate of SiN by improving the film characteristics of SiN by a thermal annealing process (for example, increasing the film density or the nitrogen concentration (N/Si ratio)).

1.3 Wet Etching of SiN

The wet etching of SiN will be explained in detail.

An etching solution including $H_3PO_4$ (phosphoric acid) is used for wet etching of SiN (insulation layer 22). For example, the semiconductor substrate 10 is immersed in the etching solution which is heated to about 100° C. to 200° C., and wet etching is executed. The reaction formula of SiN and $H_3PO_4$ is as follows:

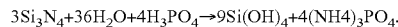

$$3Si_3N_4 + 36H_2O + 4H_3PO_4 \rightarrow 9Si(OH)_4 + 4(NH_4)_3PO_4.$$

In the etching solution, $Si(OH)_4$ (orthosilicic acid) is dissolved as a reaction product.

When the etching of SiN proceeds, and $Si(OH)_4$ concentration in the etching solution (i.e., Si concentration) exceeds the saturation solubility (e.g., 100 ppm at 100° C.), $SiO_2$ (insulation film 23) is deposited by hydro-concentration reaction. The film density of the deposited $SiO_2$ is equal to or less than the film density of $SiO_2$ formed by using plasma chemical vapor deposition (CVD).

The present embodiment focuses on the relation between the aforementioned wet etching condition and deposition of $SiO_2$, and $SiO_2$ is deposited by increasing the Si concentration in the etching solution in the vicinity of the semiconductor substrate 10. Then, the deposition amount of $SiO_2$ is controlled by the wet etching condition and the wet etching time to control the rate of blocking the gap between the interconnect layers 21 (the size of air gap AG). Specifically, when the semiconductor substrate 10 is stationarily immersed in the etching solution, i.e., the etching solution is hardly stirred, SiN (insulation layer 22) is etched between the adjacent interconnect layers 21, and the Si concentration of the etching solution is increased. If the Si concentration exceeds the saturation solubility, $SiO_2$ (insulation film 23) is deposited. As the amount of SiN being etched increases, the amount of Si dissolved in the etching solution increases. As a result, the deposition amount of $SiO_2$ increases, and the rate of blocking the gap becomes high. That is, the air gap AG is likely to become smaller. In addition, no SiN to be etched is present on the upper surface or side surface of the insulation layer 20. However, since dissolved Si (i.e., $Si(OH)_4$) discharged from the slit SLT is retained in the vicinity of the semiconductor substrate 10, $SiO_2$ (insulation film 23) is deposited, in a similar manner to the inside the slit SLT.

Next, the relation between the wet etching condition and the deposition rate will be explained in detail. FIG. 8 is a table showing the relation between the wet etching condition and the deposition rate.

As shown in FIG. 8, using the etching solution which is high in the Si concentration causes the deposition rate of $SiO_2$ to increase.

If the $H_3PO_4$ concentration in the etching solution increases, the Si saturation solubility in the etching solution becomes high, thereby making the deposition of $SiO_2$ difficult. Accordingly, the deposition rate is decreased.

If the $H_3PO_4$ temperature (the temperature of the etching solution) increases, the Si saturation solubility in the etching solution becomes high, thereby making it difficult to deposit $SiO_2$. Accordingly, the deposition rate is decreased.

If the flow speed of the etching solution on the surface of the semiconductor substrate 10 increases, the etching solution is stirred more. Accordingly, it becomes difficult to increase the Si concentration of the etching solution in the vicinity of the semiconductor substrate 10. Therefore it becomes difficult to deposit $SiO_2$, and the deposition rate is decreased. It should be noted that the etching rate of SiN basically does not depend on the flow speed of the etching solution.

Thus, if the deposition rate of $SiO_2$ is intended to be lowered, the Si concentration in the etching solution may be decreased, the $H_3PO_4$ concentration in the etching solution may be increased, the temperature of the etching solution is increased, or the flow speed of the etching solution is increased.

Next, the flow speed of the etching solution will be explained in detail. For example, the flow speed of the etching solution on the front surface of the semiconductor substrate 10 can be increased by increasing any one of the circulation speed of the etching solution, the fluctuation speed, or the fluctuation width of the semiconductor substrate 10 immersed in the solution. In addition, if the fluctuation direction of the semiconductor substrate 10 is changed, the stirring status of the etching solution will be changed.

For example, when the semiconductor substrate 10 is fluctuated in a horizontal orientation, the etching solution is stirred on the front surface of the semiconductor substrate 10 more than when being fluctuated in the vertical orientation. Accordingly, the deposition rate of $SiO_2$ is decreased. If the time of fluctuating the semiconductor substrate 10 immersed in the etching solution becomes longer, the etching solution is stirred more. Accordingly, the deposition rate of $SiO_2$ is decreased.

The wet etching of SiN in the present embodiment is implemented by a wet etching apparatus which is capable of controlling one of the Si concentration, the $H_3PO_4$ concentration, the $H_3PO_4$ temperature (temperature of the etching solution), the circulation speed of the etching solution, and the fluctuation speed, the fluctuation width, the fluctuation direction and the fluctuation time of the semiconductor substrate 10.

In the above explanation, the semiconductor substrate 10 is fluctuated in the etching solution. However, the etching solution may be stirred by using, for example, an ultrasonic fluctuation apparatus.

In addition, the flow speed of the etching solution may be discretionarily changed during the wet etching. For example, it may be possible that the semiconductor substrate 10, which is stationarily immersed in the etching solution for a predetermined time, is fluctuated in order to control deposition of $SiO_2$.

1.4 Advantageous Effects of Present Embodiment

In the following, the advantageous effects of the present embodiment will be described.

When forming an air gap between the adjacent interconnect layers, a slit is formed between the interconnect layers, and then a film of $SiO_2$ with a high deposition rate (with poor step coverage) is formed by using, for example, plasma CVD. By so doing, the slit between the adjacent interconnect layers is blocked at the interconnect end portion, and an air gap is formed. The above method is generally known. In this case, the $SiO_2$ film deposition rate at the upper surface of the semiconductor substrate becomes fastest. Thus, for example, the slit frontage is blocked first in the structure exposing the end portions of stacked interconnect layers within the slit and having a gap between the adjacent interconnect layers. Otherwise, the gap between interconnect layers at the upper layer is blocked earlier in the stacked interconnect layer, and the shape of the air gap may vary in the upper layer and the lower layer. To solve such a problem, there is a method of forming an air gap by providing a convex part at the end of interconnect layer to narrow the width of the space between interconnect layers, and forming a $SiO_2$ film in the condition of better step coverage. This method, however, increases the manufacturing steps, and increases the manufacturing costs.

In contrast, the embodiment applies depositing the insulation film 23 out in the vicinity of the area (gap) where the insulation layer 22 is etched when wet etching the insulation layer 22 in the structure having the insulation layer 22 between the adjacent interconnect layers 21, and blocking the gap to form an air gap AG. Accordingly, the air gap AG can be formed without applying another etching step or a film deposition step, for example. Therefore, the embodiment can suppress an increase of the manufacturing steps or the manufacturing costs for forming an air gap AG.

In addition, the present embodiment decreases the flow speed of the etching solution on the front surface of the semiconductor substrate 10 when wet etching the insulation layer 22. By this process, the Si concentration of the etching solution in the vicinity of the semiconductor substrate 10, i.e., the area where the insulation layer 22 is etched, is increased to deposit the insulation film 23. Accordingly, the area of deposition can be controlled by forming the area where the insulation film 23 should be deposited by the insulation layer 22. Therefore, an air gap AG can be formed even in the complicated structure where the stacked interconnect layers are exposed to the inside of the slit.

Furthermore, the present embodiment applies an air gap AG between the adjacent interconnect layers, which can reduce a capacitance between the interconnects. With this configuration, the signal delay due to the capacitance between the interconnects is reduced, and the processing speed can be improved. The intervals between interconnects can be narrowed because of the reduction of the capacitance between the interconnects, thereby accomplishing miniaturization of the semiconductor device.

The present embodiment applies the deposited insulation film 23, which can reduce the capacitance between the interconnects. For example, the deposited $SiO_2$ (insulation film 23) tends to have a film density lower than that of a $SiO_2$ film formed by plasma CVD using tetraethyl orthosilicate (TEOS) or SiH4. Accordingly, a dielectric constant of the deposited $SiO_2$ is lower than that of the $SiO_2$ film formed by plasma CVD. With this structure, the present embodiment can reduce the capacitance between the interconnects.

In the present embodiment, the flow speed of the etching solution is decreased by controlling the circulation speed of the etching solution, and controlling the fluctuation speed and fluctuation width of the semiconductor substrate 10 during wet etching of the insulation layer 22, thereby increasing the Si concentration of the etching solution near the area where the insulation layer 22 is etched. Accordingly, the deposition amount of $SiO_2$, and the rate of blocking the gap (the size of air gap AG) can be controlled.

In the present embodiment, stirring of the etching solution is controlled by controlling the fluctuation direction and fluctuation time of the semiconductor substrate 10 during wet etching of the insulation layer 22, thereby controlling the Si concentration of the etching solution near the area where the insulation layer 22 is etched. With this structure, the rate of blocking the gap can be controlled.

In the present embodiment, the deposition rate of the insulation film 23 can be increased by increasing the Si concentration of the etching solution during wet etching of the insulation layer 22. By controlling the deposition rate of the insulation film 23, the rate of blocking the gap can be controlled.

In the present embodiment, the allowed saturation solubility of Si in the etching solution is controlled by controlling the $H_2PO_4$ concentration and the $B_3PO_4$ temperature (temperature of the etching solution), thereby controlling the deposition rate of the insulation film 23. With this structure, the rate of blocking the gap can be controlled.

In the present embodiment, the wet etching rate of the insulation layer 22 is changed by improving the film characteristics of the insulation layer 22 by a thermal annealing process, thereby changing the rate of blocking the gap. Specifically, if SiN (insulation layer 22), for example, is subjected to a thermal annealing process in the nitrogen atmosphere, the nitrogen concentration (N/Si ratio) of SiN is increased, and the film density is increased. As a result, the deposition rate of $SiO_2$ is lowered because of a decrease in the wet etching rate of SiN. Thus, the rate of blocking the gap becomes lower for SiN subjected to the thermal processing even if the wet etching is performed for the same time period.

2. Second Embodiment

A semiconductor device according to the second embodiment and a method of manufacturing the semiconductor device will be explained. The method of forming a interconnect layer is different from the first embodiment. In the following, only the items different from the first embodiment will be explained.

2.1 Method of Forming an Air Gap

The method of forming an air gap will be explained. FIGS. 9 to 14 are cross-sectional views of the memory cell array in the manufacturing step of the semiconductor device.

As shown in FIG. 9, the plurality of sacrificial films 25 and the insulation layers 22 are alternately stacked on one another, and a plurality of memory pillars MP passing through the plurality of sacrificial films 25 and the insulation layers 22 and connected to the p-type well 11 are formed in each string unit SU. Then, the insulation layer 20 that covers the entire string unit SU is formed. A sacrificial film 25 is formed by a material having a sufficiently fast etching rate for wet etching relative to the insulation layer 20 and the insulation layer 22.

Specifically, the insulation layer 20 is formed, for example, of $SiO_2$ formed by plasma CVD, the insulation layer 22 is formed of SiN, and the sacrificial film 25 is formed of an inorganic spin on glass (SOG) having a film density lower than $SiO_2$ used for the insulation layer 20. In this case, by performing wet etching with the HF type etching solution, the inorganic SOG has the etching rate higher than SiN and $SiO_2$ formed by plasma CVD. Accordingly, an etching selective rate sufficient for selectively removing the inorganic SOG can be obtained.

A slit SLT is then formed to expose an end (side surface) of the insulation layer 22 and the sacrificial film 25 of each string unit SU, as shown in FIG. 10.

Figure 11:
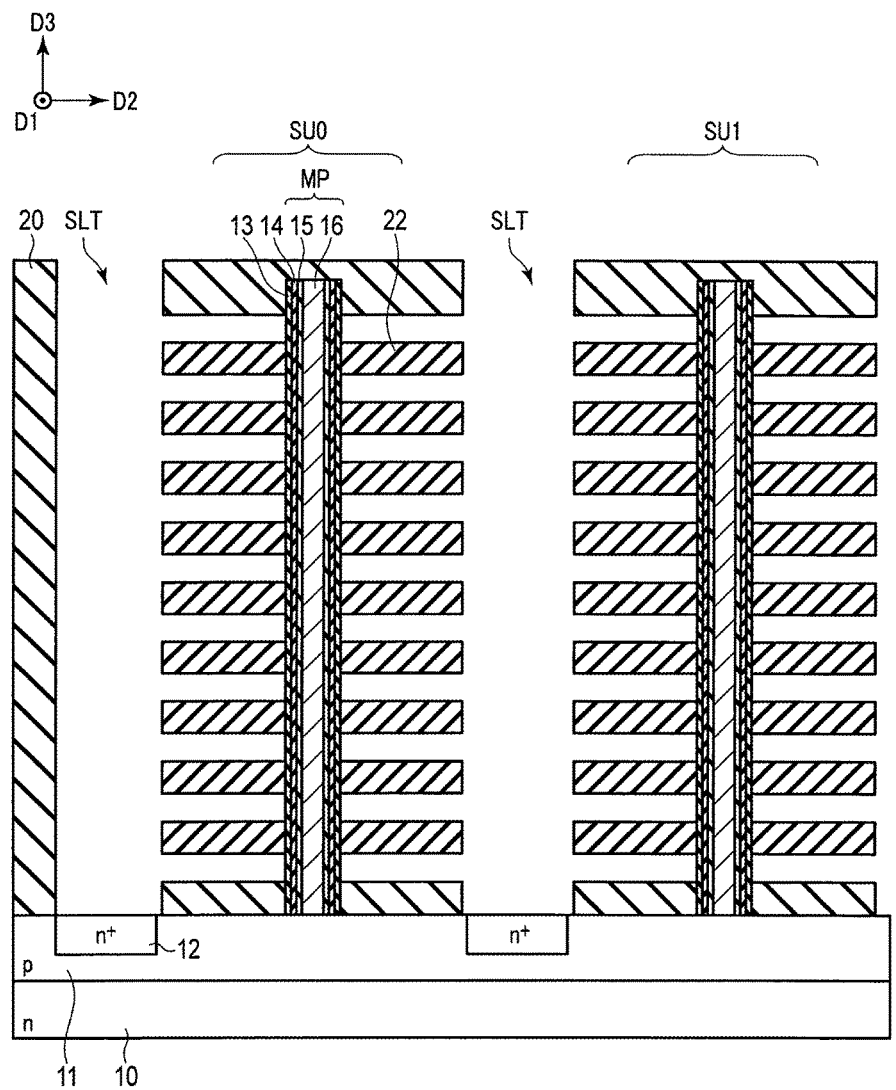

Next, the sacrificial film 25 is wet etched to form a gap between the insulation layer 20 and the insulation layer 22 and between the adjacent insulation layers 22, as shown in FIG. 11.

Then, a TiN (titanium nitride) 26 is formed, for example, by CVD, as a barrier metal so as to cover the entire upper surface of the semiconductor substrate 10. A W 27 is then formed, for example, by CVD. The gaps between the insulation layer 20 and the insulation layer 22 and between the adjacent insulation layers 22 are accordingly filled.

Figure 13:
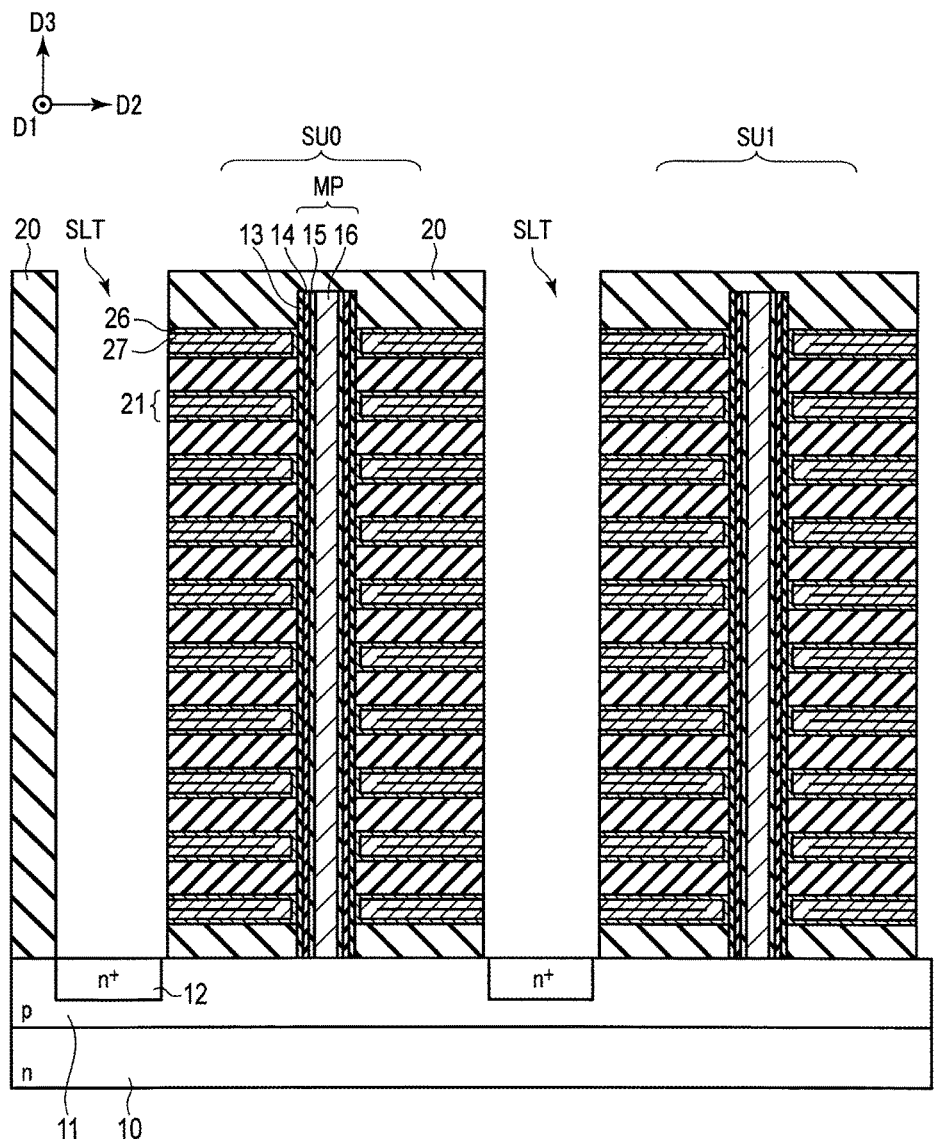

Next, TiN 26 and W 27 formed on the upper surface of the insulation layer 20 and within the slit SLT are removed by etching, as shown in FIG. 13. The interconnect layers 21 are formed accordingly by TiN 26 and W 27. That is, the upper and lower surfaces of W 27 are covered with TiN 26.

Figure 14:
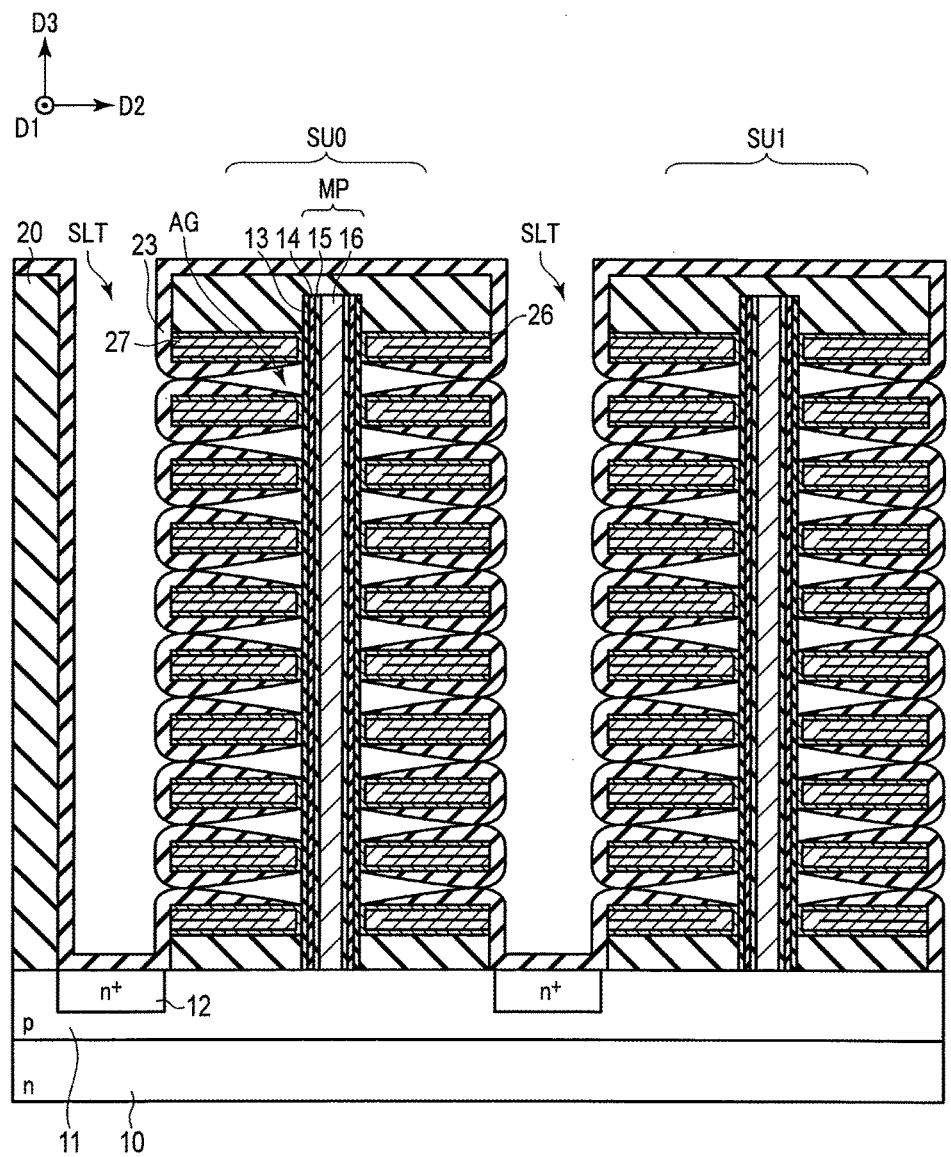

Next, the insulation layer 22 is wet etched as shown in FIG. 14. The insulation film 23 (for example, $SiO_2$) and the air gap AG are formed at this time.

In the above explanation, the case where TIN 26 and W 27 are used for the interconnect layers 21 was explained; however, any conductive material exhibiting the high etching resistance relative to the etching solution may be used when wet etching the insulation layer 22. In addition, a conductive material used for the interconnect layer 21 may be a single-layer film, or a film of two or more-layers. Furthermore, a thin film of $SiO_2$, for example, may be formed on upper and lower surfaces of the interconnect layer 21 to cover the upper and lower surface the interconnect layer 21.

2.2 Advantageous Effects of Present Embodiment

The present embodiment can produce the same effect as the first embodiment.

In the present embodiment, the upper and lower surfaces of the interconnect layer 21 can be covered with a material exhibiting the high etching resistance relative to the etching solution used for the insulation layer 22. With this structure, the interconnect layer 21 can be prevented from being etched and being reduced in thickness during wet etching.

3. Third Embodiment

A semiconductor device according to the third embodiment and a method of manufacturing the semiconductor device will be explained. The third embodiment is different from the first and second embodiments in the method for blocking the gap between the adjacent interconnect layers. In the following, only the items different from the first embodiment will be explained.

3.1 Method of Forming an Air Gap

Figure 16:
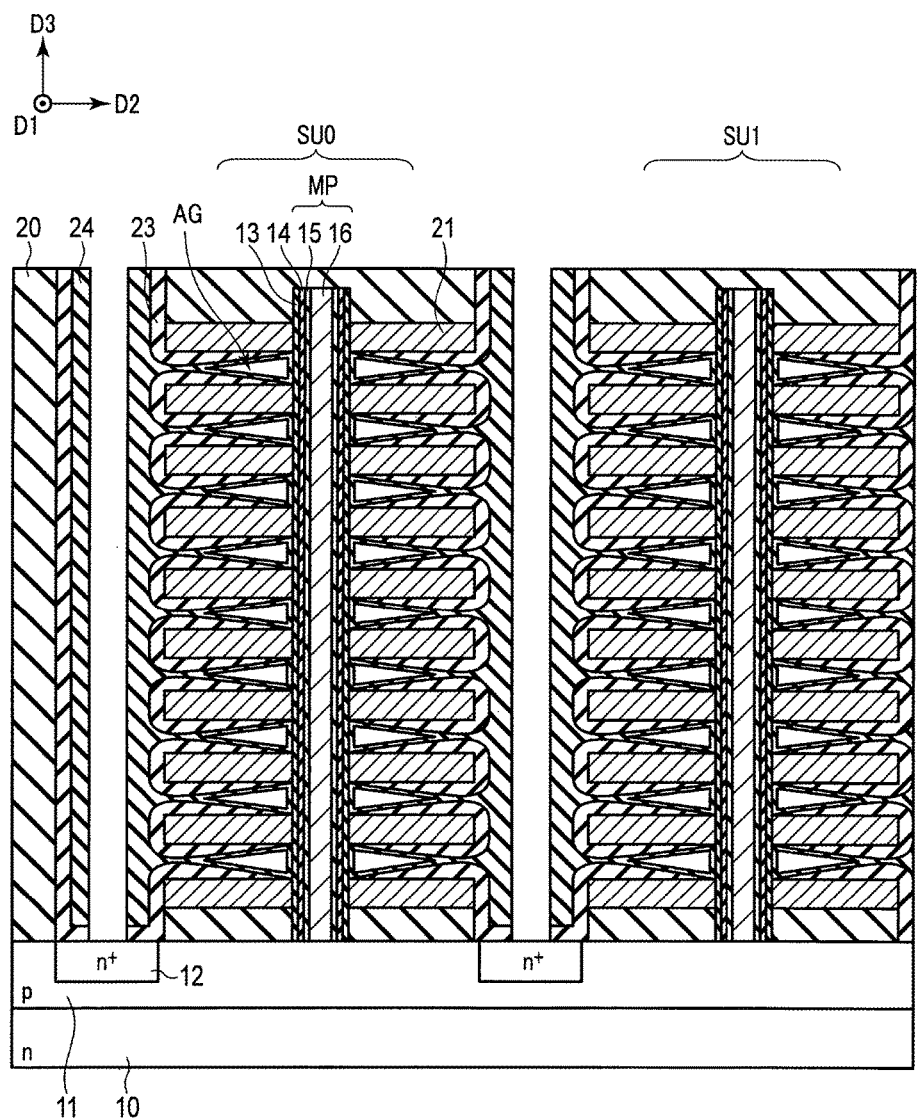

The method of forming an air gap will be explained. FIGS. 15 and 16 are cross-sectional views of the memory cell array in the manufacturing step of the semiconductor device.

First, the insulation layer 22 (SiN) is wet etched, and the insulation film 23 ($SiO_2$) is formed at the same time, as shown in FIG. 15. In this case, the amount of the insulation film 23 to be deposited is set to be smaller than the first and second embodiments to avoid blocking the gap between the interconnect layers 21 by the insulation film 23.

Then, the insulation layer 24 is formed on the sidewall of the slit SLT to cover the insulation layer 23, as shown in FIG. 16. The insulation film 23 and the gap are accordingly covered with the insulation layer 24, and the gap between the interconnect layers 21 is blocked. By this process, an air gap AG is formed.

3.2 Advantageous Effects of Present Embodiment

The present embodiment can produce the same effect as the first and second embodiments.

In the present embodiment, the air gap AG can be formed by blocking the gap between the interconnect layers 21 using the insulation film 23 and the insulation layer 24. Since the gap is not blocked when wet etching the insulation layer 22, it is possible to suppress residual etching solution in the gap.

In addition, the gap is blocked by the insulation layer 24 in this embodiment. Accordingly, even when the width between the adjacent interconnect layers 21 varies, or the deposition speed of the insulation film 23 varies, the gap can be securely blocked by the insulation layer 24.

4. Modified Example, etc.

In general, according to the aforementioned embodiments, a method of manufacturing a semiconductor device includes: forming a first film (21 @ FIG. 4) including a conductive material above a semiconductor substrate; forming a second film (22 @ FIG. 4) including Si and N on the first film; forming a third film (21 @ FIG. 4) including a conductive material on the second film; exposing a part of the second film; and wet etching the second film. In the wet etching, a first and second insulation films (23 @ FIG. 6) each including Si are deposited on side surfaces of the first and third films, and part of a space between the first and third films is blocked by the first and second insulation films to form an air gap (AG @ FIG. 6) between the first and third films.

By applying the aforementioned embodiments, it is possible to provide a semiconductor device having an air gap structure that can reduce manufacturing costs. Note that the embodiments are not limited to the above-explained aspects, and different variations are possible.

The aforementioned embodiments adopt a slit SLT; however, a hole passing through the interconnect layer 21 and the insulation layer 22, for example, may be formed.

In the aforementioned embodiments, a memory hole MH passing through the interconnect layer 21 and the insulation layer 20 is formed, and an air gap AG may be then formed by using the memory hole MH.

In addition, in the aforementioned embodiments, an air gap AG may be formed between the semiconductor substrate 10 and the select gate line SGS, and an air gap AG may be formed between the select gate line SGD and the interconnect layer provided above (not shown in the drawings).

Furthermore, the aforementioned embodiments can be applied to a three-dimensional stacked NAND flash memory which is different from the first to third embodiments. For example, a structure in which the semiconductor layer of the NAND strings 115 has a U-shape toward above the semiconductor substrate may be applied. In addition, the aforementioned embodiments can be applied not only to the NAND flash memory, but also to a semiconductor memory device using other storage units. The aforementioned embodiments are not limited to the semiconductor memory device, but may be applied to a semiconductor device in which the interconnect layers are stacked.

In the aforementioned embodiments, the state indicated by the terms "connect" and "couple" includes a state where elements are indirectly connected through an element such as a transistor or a resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
   forming a first film including a conductive material above a semiconductor substrate;
   forming a second film including Si (silicon) and N (nitrogen) on the first film;
   forming a third film including a conductive material on the second film;
   exposing part of the second film; and
   wet etching the second film,
   wherein in the wet etching, a first and second insulation films each including Si are deposited on side surfaces of the first and third films, and part of a space between the first and third films is blocked by the first and second insulation films to form an air gap between the first and third films.

2. The method according to claim 1, wherein the wet etching includes etching the second film by providing an etching solution including $H_3PO_4$ (phosphoric acid) to the second film.

3. The method according to claim 1, wherein the wet etching includes controlling a size of the air gap by controlling at least one of a fluctuation speed, a fluctuation width, a fluctuation direction, and a fluctuation time of the semiconductor substrate immersed in an etching solution.

4. The method according to claim 1, further comprising:
   forming a pillar that passes through the first to third films, is in contact with the semiconductor substrate at a bottom surface of the pillar, and includes a semiconductor layer and a third insulation film, a charge accumulation layer, and a fourth film stacked on a side surface of the semiconductor layer after the forming the third film.

5. The method according to claim 1, wherein the exposing part of the second film includes forming a slit in which the semiconductor substrate is exposed at a bottom surface of the slit, and a side surface of the first to third films is exposed at a side surface of the slit.

6. The method according to claim 1, wherein the second film is of SiN (silicon nitride).

7. The method according to claim 1, wherein the first and second insulation films are of $SiO_2$ (silicon dioxide).

8. The method according to claim 1, wherein the first and third films include W (tungsten) and TiN (titanium nitride) that covers part of the W.

9. The method according to claim 2, wherein the wet etching includes controlling a size of the air gap by controlling at least one of a Si concentration of the etching solution including $H_3PO_4$, a $H_3PO_4$ concentration, a $H_3PO_4$ temperature, and a circulation speed of the etching solution.

* * * * *